United States Patent
Kesler et al.

(10) Patent No.: US 6,369,646 B1
(45) Date of Patent: Apr. 9, 2002

(54) LEAKAGE CURRENT COMPENSATION CIRCUIT

(75) Inventors: Scott B. Kesler, Kokomo; Thomas L. Dinkledine, Russiaville, both of IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/771,056

(22) Filed: Jan. 29, 2001

(51) Int. Cl.[7] .............................................. H01L 25/00
(52) U.S. Cl. ....................... 327/564; 327/578
(58) Field of Search ................. 327/564, 565, 327/578

(56) References Cited

U.S. PATENT DOCUMENTS

| | | | |
|---|---|---|---|
| 3,673,508 A | * | 6/1972 | Callahan, Jr. ............... 327/578 |
| 4,763,028 A | | 8/1988 | Henry ......................... 307/573 |
| 5,453,712 A | * | 9/1995 | Hancock ..................... 323/312 |

OTHER PUBLICATIONS

William C. Till et al., "Integrated Circuits: materials, devices, and fabrication," pp. 181–184, 1982, Prentice–Hall, Inc.

* cited by examiner

Primary Examiner—Jeffrey Zweizig
(74) Attorney, Agent, or Firm—Jimmy L. Funke

(57) ABSTRACT

A compensation circuit provides a compensation current to a node of an integrated circuit that experiences increased reverse-bias leakage current between a n-type leaking epitaxial region and a p-type substrate with increased temperature. The compensation circuit includes a p-type substrate, a n-type compensator epitaxial region, an contact region, a center p-type region and a plurality of peripheral p-type regions. The peripheral p-type regions function as either a node collector or a reference collector. The compensation current is substantially determined by the ratio of the total peripheral surface area facing the center p-type region associated with the node collector and the total peripheral surface area facing the center p-type region associated with the reference collector and is also determined by the total surface area of the n-type compensator epitaxial region.

24 Claims, 2 Drawing Sheets

LEAKAGE CURRENT COMPENSATION CIRCUIT

TECHNICAL FIELD

The present invention is directed to leakage current compensation for an integrated circuit (IC), and more specifically to a compensation circuit that functions over a wide temperature range.

BACKGROUND OF THE INVENTION

Higher packaging densities and the expense and/or ineffectiveness of traditional techniques for removing heat (e.g., heat sinks) from electronic assemblies (e.g., integrated circuits (ICs)) has resulted in a demand for IC designs that continue to function with increasingly higher temperatures. One aspect of high temperature IC operation is the inherent current leakage that occurs across reverse-biased semiconductor junctions. While in many cases, leakage currents are negligible at low operating temperatures, leakage currents can become significant as the operating temperature increases. In bipolar analog circuitry, the greatest point of leakage is generally from the n-type epitaxial pockets which contain and isolate both NPN and PNP transistors, as well as resistors. This leakage current can result in an undesirable error in a number of applications, such as those that require low bias current conditions or the maintenance of an electrical charge, e.g., integrators and sample-and-hold circuits. For example, in the automotive field many electronic assemblies, e.g., pencil coil assemblies, are located approximate each engine cylinder, which subjects the assembly to a wide range of temperatures.

Prior art leakage compensation circuits (i.e., compensators) have usually required some component trimming for a given compensator to properly account for leakage currents. Further, component trimmed compensators have required silicon area for trim networks and access points, used to perform trimming operations, in addition to the area consumed by the compensator. In addition, most prior art compensators have been directed to metal-oxide semiconductor field-effect transistor (MOSFET) devices that have required detailed device characterization, with respect to temperature dependence of the device.

As such, what is needed is a compensation circuit that is designed to compensate for specific leakage currents, at the time of device layout, that does not require adjustment after fabrication. Further, it would be desirable if the compensation circuit accurately accounted for the leakage currents in a fashion that both matched and compensated for the temperature related characteristics of a given n-type leaking epitaxial pocket.

SUMMARY OF THE INVENTION

An embodiment of the present invention is directed to a compensation circuit for providing a compensation current to a node of an integrated circuit that experiences increased reverse-bias leakage current, between a n-type leaking epitaxial region and a p-type substrate, with increased temperature. The compensation circuit includes a p-type substrate, a n-type compensator epitaxial region, a contact region, a center p-type region and a plurality of peripheral p-type regions. The n-type compensator epitaxial region is formed on the p-type substrate. The contact region is formed into the n-type compensator epitaxial region. The center p-type region is formed into the n-type compensator epitaxial region and is surrounded by the plurality of peripheral p-type regions, which are also formed into the n-type compensator epitaxial region. At least one of the peripheral p-type regions is coupled to the contact region to serve as a reference collector. Any remaining peripheral p-type region is coupled to the node of the integrated circuit that is experiencing increased reverse-bias leakage current to serve as a node collector and provide the compensation current. The compensation current provided is substantially determined by the ratio of the total peripheral surface area facing the center p-type region associated with the node collector and the total peripheral surface area facing the center p-type region associated with the reference collector and is also determined by the total surface area of the n-type compensator epitaxial region.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS(S)

The present invention is directed to a leakage current compensation circuit (i.e., a compensator) that provides accurate leakage current compensation across a full operating temperature range without the need for trimming of components to adjust for silicon fabrication processing variations. The compensator requires minimal silicon area (i.e., no additional silicon area is required for trim networks and access points), and leakage current of a connected device is compensated during device layout. The compensator effectively compensates for n-type epitaxial pocket current leakage at any circuit node connected to any number of transistors or resistor isolation pockets. The compensator is adjusted for the specific leaking device at the time of device layout by matching the n-type epitaxial area (i.e., bottom and side wall surface areas) of the leaking pocket(s) (or a ratio of the surface areas) with that of the compensator.

Figure 1A:
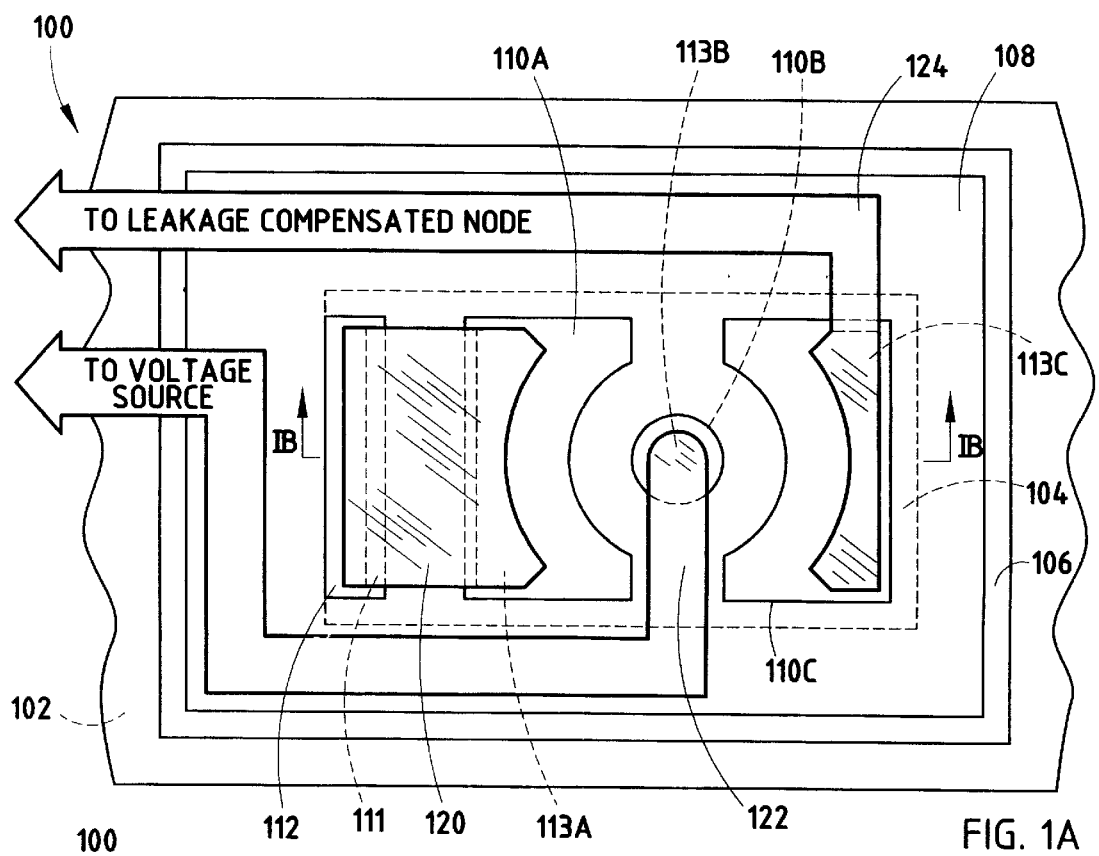
FIG. 1A is a top view of a compensation circuit, according to an embodiment of the present invention.
Figure 1B:
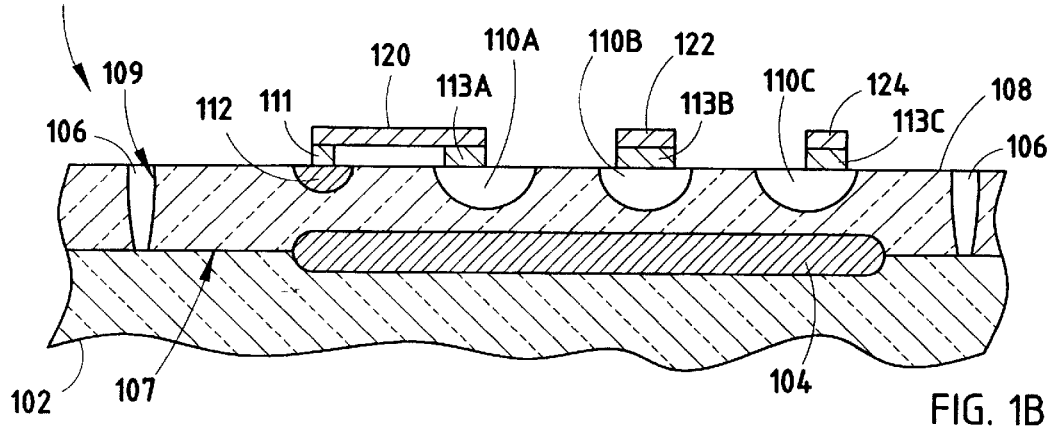
FIG. 1B is a cross-sectional view, along the line IB—IB, of the compensation circuit of FIG. 1A.

FIGS. 1A–1B illustrate a top view and a cross-sectional view (along the line IB—IB), respectively, of a compensator 100 that is formed on a p-type substrate 102, which is, preferably, the same substrate on which the device that requires compensation is formed (i.e., the compensator is monolithically formed with the device that requires compensation). A n-type epitaxial pocket 108 is isolated from surrounding integrated circuitry by a p$^+$ isolation diffusion 106. As shown in FIGS. 1A–1B, the n-type epitaxial pocket (i.e., the n-type compensator epitaxial region) 108 contains three p-type diffusions; a circular center region 110B, which is surrounded by two peripheral regions (i.e., peripheral p-type regions) 110A and 110C. The circular center region 110B, which can be equated to an emitter (E) of a PNP transistor (see FIG. 1C), is coupled through a contact 113B and metalization 122 to a high potential node (e.g., a voltage source), which provides a source of current to compensate for a leakage current $I_O$. The peripheral region 110A is coupled (through a contact 113A, metalization 120, a contact 111 and a n+ diffusion, i.e., a contact region, 112) to the n-type epitaxial pocket 108. The peripheral region 110C is coupled, through a contact 113C and metalization 124, to a node that may experience an undesirable leakage current (i.e., a leakage compensated node). In a preferred embodiment, a n+ buried layer 104 exists under the regions 110A, 110B and 110C to minimize vertical PNP transistor action and to match the leakage characteristics of the offending pocket (i.e., the n-type leaking epitaxial region).

Figure 1C:
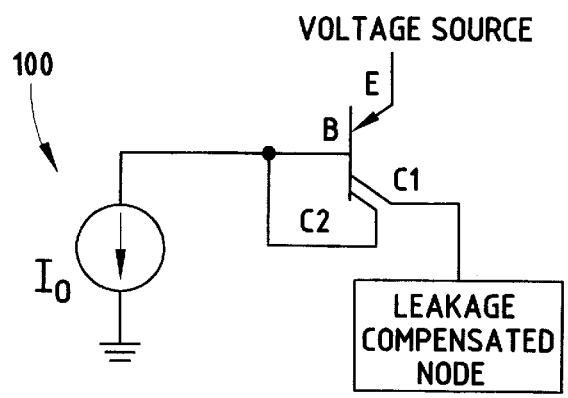
FIG. 1C is an electrical schematic of the compensation circuit of FIGS. 1A–1B.

As shown schematically in FIG. 1C, topologically, the compensator 100 is similar to a PNP transistor with a split collector. As mentioned above, the center region 110B is analogous to an emitter (E) of a PNP transistor. The region 11A, as shown, is coupled to the n-type epitaxial pocket 108 through a n+ diffusion 112 and acts as a second collector (C2) that is coupled to a base (B) of the PNP transistor. The region 110C acts as a first collector (C1), which is connected to a leaking node. In this configuration, the PNP structure is effectively working as a single element current mirror: where the current provided by the collector (C1) tied to the node of concern is some ratio (e.g., 1:1) of the current in the collector (C2) tied back to the base (B), i.e., the n-type epitaxial region 108. Since the second collector (C2) is tied to the n-type epitaxial region 108 and no other connection is made to the n-type epitaxial region 108, the current in the second collector (C2) is simply the leakage current $I_O$ between the epitaxial region 108 and the isolation junction formed by the substrate 102 and diffusion 106. When the surface area of the bottom wall 107 of the n-type epitaxial region 108 is large (i.e., around an order of magnitude) with respect to the surface area of the side wall 109 of the n-type epitaxial region 108; the surface area of the side wall 109 can be essentially ignored. This is normally applicable to high power devices, e.g., power transistors.

As is shown schematically in FIG. 1C, the base (B) of the compensator 100 is not hard wired to a node that can provide a base drive current and, as such, the compensator 100, in an ideal operating condition, remains off; thereby providing no compensation current to the leakage compensated node of the leaking device(s). However, the n-type epitaxial region 108 does leak with a reverse saturation leakage current $I_O$ approximately defined by the following equation:

$$Io = q \cdot A \cdot \left[ \frac{D_p}{L_p} \cdot \frac{(n_i)^2}{N_D} \right]$$

In the above equation, 'q' is the electronic charge, 'A' is the area of the junction, '$D_p$' is the hole diffusion constant, '$L_p$' is the hole minority carrier diffusion length, '$n_i$' is the intrinsic carrier concentration of the silicon and '$N_D$' is the ionized donor concentration.

Notably, the reverse bias voltage does not occur in the above equation. Since the leakage current $I_O$ is also independent of the supply voltage, the compensator 100 can be operated from a wide range of supply voltages. This is advantageous in that, if necessary, the compensator can be connected directly to an unregulated internal voltage supply that is associated with the device that requires compensation. Further, because the compensator 100 operates effectively down to a collector-to-emitter voltage ($V_{ce}$) of 0.5 volts, the compensator 100 functions properly with a very low supply voltage. The ratio of the total peripheral surface area (A2/A1) of the two collectors (C2/C1) substantially determines the effective gain of the compensation current relative to the leakage current $I_O$, which is determined by the area of the isolation junction of the n-type leaking epitaxial pocket.

In the simplest configuration, the collectors (C1 and C2) have equal and similar peripheral surface areas (A1 and A2) facing the emitter region and similar volumes. In this configuration, the n-type compensator epitaxial region is sized to match that of a n-type epitaxial leaking region. If a plurality of leaking devices are handled by one compensator, the ratio of the total peripheral surface area facing the center p-type region of a node collector (i.e., the collector(s) tied to the leakage compensated node) to the total peripheral surface area facing the center p-type region of a reference collector (i.e., the collector(s) tied back to the base of the compensator) can be scaled to match the ratio of the sum of the total surface areas of the n-type leaking epitaxial region (s) to the total surface area of the n-type epitaxial region of the compensator. In this situation, some small amount of compensation error may be exchanged for a smaller compensator surface area, when the exact epitaxial pocket topology is difficult to match.

An advantage of the compensator 100, according to the present invention, is that the compensator device is self-adjusting for parametric variations arising from the silicon fabrication process and photolithography, since the n-type compensator epitaxial region area (or some ratio of the area) is matched with that of the n-type leaking epitaxial region area. As such, it is not necessary to know the amount of leakage current $I_O$ expected from the total surface area for any of the devices connected to the node that is to be compensated. The fact that the areas are matched geometrically causes the leakages to track each other across various processing and environmental conditions, including variations in temperature. Further, adjustment (i.e., trimming) of the device, after fabrication, is not necessary. As such, a compensator, according to the present invention, can be utilized beneficially in applications such as long-time constant integrators, where leakage current from an integration comparator node may otherwise produce significant error in the final integration result. Further, such compensators are especially useful in automotive-type environments where various automotive devices (e.g., automotive integrated circuits such as integrators and sample-and-hold circuits) may experience a wide range of temperatures.

Figure 2A:
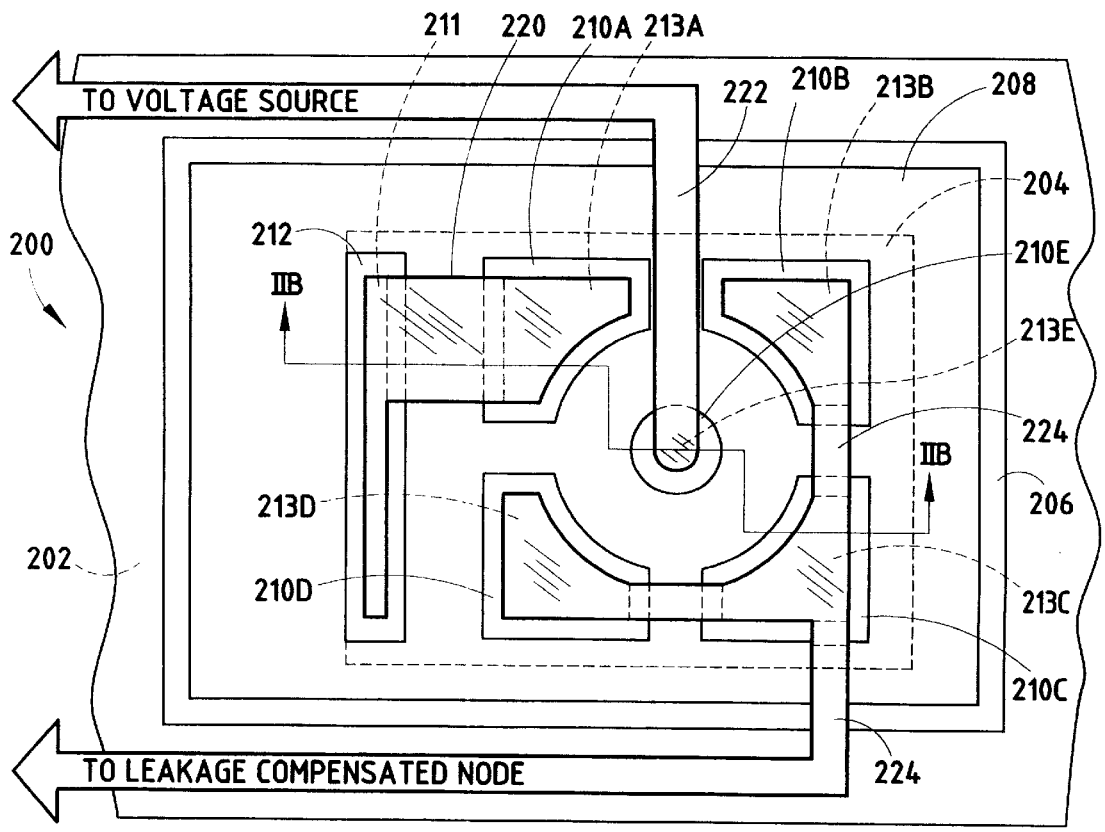
FIG. 2A is a top view of a compensation circuit, according to another embodiment of the present invention.
Figure 2B:
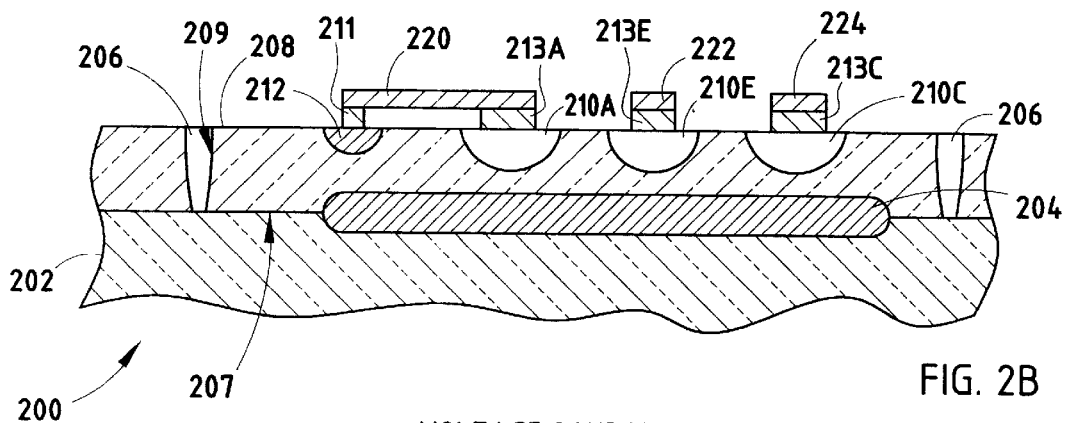
FIG. 2B is a cross-sectional view, along the line IIB—IIB, of the compensation circuit of FIG. 2A.

FIGS. 2A–2B show a top view and a cross-sectional view (along the line IIB—IIB), respectively, of a compensator 200 that is formed on a p-type substrate 202 (preferably, the same substrate on which the device that requires compensation is formed), according to another embodiment of the present invention. A n-type epitaxial pocket (i.e., a n-type compensator epitaxial region) 208 is isolated from surrounding integrated circuitry by a $p_+$ isolation diffusion 206. As shown, the n-type epitaxial pocket 208 contains five p-type diffusions: a circular center region 210E surrounded by four peripheral regions 210A, 210B, 210C and 210D.

Figure 2C:
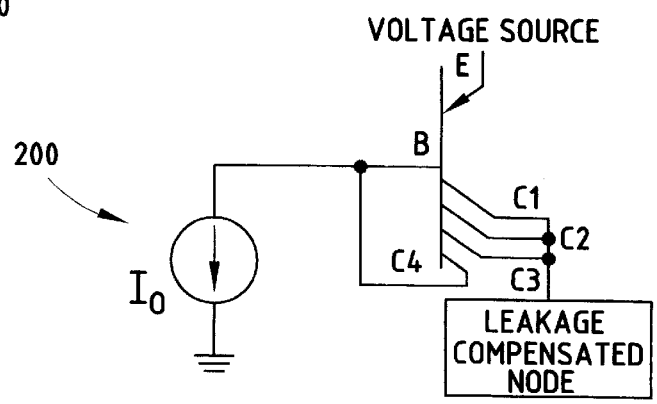
FIG. 2C is an electrical schematic of the compensation circuit of FIGS. 2A—2B.

The circular center region 210E, which can be equated to an emitter (E) of a PNP transistor (see FIG. 2C), is coupled through a contact 213E and metalization 222 to a high potential node (e.g., a voltage source), which provides a source of current to compensate for the leakage current of the offending pocket(s). The peripheral region 210A is preferably coupled, through a contact 213A, metalization 220, a contact 211 and a n⁺ diffusion (i.e., a contact region) 212, to the n-type epitaxial pocket 208. The peripheral regions 210B, 210C and 210D are coupled (through contacts 213B, 213C and 213D and metalization 224) to a node (i.e., a leakage compensated node) that may experience an undesirable leakage current. Preferably, a n⁺ buried layer 204 exists under all of the regions, 210A, 210B, 210C, 210D and 210E; to minimize vertical PNP transistor action and to match the leakage characteristics of the offending pocket.

Topologically, the compensator 200 is also similar to a PNP transistor with a split collector (C1, C2, C3 and C4). As mentioned above, the center region 210E is analogous to an emitter (E) of a PNP transistor. The region 210A, as shown, is coupled to the n-type epitaxial pocket 208 through a n⁺ diffusion 212 and acts as a fourth collector (C4) that is coupled to a base (B) of the PNP transistor. The regions 210B, 210C and 210D act as a first, second and third collector (C1, C2 and C3), which are connected to a node of a leaking device. In this configuration, the PNP structure is effectively operating as a single element current mirror where the current, provided by the combined collectors (C1, C2 and C3) tied to the node of concern, is a ratio (e.g., 3:1 providing the total peripheral areas and volumes of the collectors C1, C2, C3 and C4 are equal) of the current in the collector (C4) tied back to the n-type epitaxial region 208. Since the fourth collector (C4) is tied to the epitaxial region 208 and no other connection is made to the epitaxial region 208, the current in the fourth collector (C4) is simply the leakage current $I_O$ between the epitaxial region 208 and the isolation junction formed by the substrate 202 and diffusion 206. Alternatively, if desired, multiple collectors can be tied back to the base (B). For example, if the fourth, third and second collectors (C4, C3 and C2) are tied to the base (B) and the first collector (C1) is tied to the node requiring leakage compensation, the compensation current will be one-third of the leakage current $I_O$ when the peripheral surface areas (A1, A2, A3 and A4) and volumes of all collectors (C1, C2, C3 and C4) are equal. The aforementioned example requires that the collectors (C1, C2, C3 and C4) have peripheral surface areas (A1, A2, A3 and A4) that are geometrically similar facing the center region 210E.

Accordingly, a compensator, according to the present invention, provides for very close tracking of leakage currents across silicon fabrication variations, since the compensation current is derived from the same junction type topology as found in the leaking device(s). Advantageously, the compensator requires no more silicon area than the device that it compensates. By adjusting the ratio of the collector regions in the compensator device, a small area compensator can be scaled to provide compensation for a larger area leaking device. Further, the compensator, according to the present invention, can be implemented utilizing a smaller silicon area, as compared to compensators that require component trimming. Finally, the compensator can be set up accurately at the time of the device layout, without exact knowledge of the leakage characteristics of the offending pocket.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the Doctrine of Equivalents.

What is claimed is:

1. A compensation circuit for providing a compensation current to a node of an integrated circuit that experiences increased reverse-bias leakage current between a n-type leaking epitaxial region and a p-type substrate with increased temperature, the compensation circuit comprising:
   a p-type substrate;
   a n-type compensator epitaxial region formed on the p-type substrate;
   a contact region formed into the n-type compensator epitaxial region;
   a center p-type region formed into the n-type compensator epitaxial region; and
   a plurality of peripheral p-type regions formed into the n-type compensator epitaxial region surrounding the center p-type region, wherein at least one of the peripheral p-type regions is coupled to the contact region to serve as a reference collector, and wherein any remaining peripheral p-type region is coupled to the node of the integrated circuit that is experiencing increased reverse-bias leakage current to serve as a node collector and provide the compensation current, where the compensation current is substantially determined by the ratio of the total peripheral surface area facing the center p-type region associated with the node collector and the total peripheral surface area facing the center p-type region associated with the reference collector, and where the compensation current is also determined by the total surface area of the n-type compensator epitaxial region.

2. The compensation circuit of claim 1, wherein the contact region is a n⁺ region.

3. The compensation circuit of claim 1, further including:
   a n⁺ buried layer located between the p-type substrate and the center and peripheral p-type regions.

4. The compensation circuit of claim 1, wherein the ratio of the total peripheral surface area facing the center p-type region associated with the node collector and the total peripheral surface area facing the center p-type region associated with the reference collector is substantially the same as the ratio of the total surface area of the leaking epitaxial region and the total surface area of the compensator epitaxial region.

5. The compensation circuit of claim 1, wherein the compensation circuit is monolithically formed on the same p-type substrate as the integrated circuit that experiences the increased reverse-bias leakage current.

6. The compensation circuit of claim 1, wherein the integrated circuit functions as an integrator.

7. The compensation circuit of claim 1, wherein the integrated circuit functions as a sample-and-hold circuit.

8. The compensation circuit of claim 1, wherein the total peripheral surface area of the node collector and the total peripheral surface area of the reference collector are substantially the same.

9. The compensation circuit of claim 8, wherein the total surface area of the leaking epitaxial region and the compensator epitaxial region are substantially the same.

10. An automotive device that automatically compensates for increased reverse-bias leakage current between a n-type leaking epitaxial region and a p-type substrate with increased temperature, the automotive device including:
    an automotive integrated circuit formed on a p-type substrate; and
    a compensation circuit formed on the p-type substrate and further including:

a n-type compensator epitaxial region formed on the p-type substrate;

a $n^+$ region formed into the n-type compensator epitaxial region;

a center p-type region formed into the n-type compensator epitaxial region;

a plurality of peripheral p-type regions formed into the n-type compensator epitaxial region surrounding the center p-type region, wherein at least one of the peripheral p-type regions is coupled to the $n^+$ region to serve as a reference collector, and wherein any remaining peripheral p-type region is coupled to the node of the integrated circuit that is experiencing increased reverse-bias leakage current to serve as a node collector and provide the compensation current, where the compensation current is substantially determined by the ratio of the total peripheral surface area facing the center p-type region associated with the node collector and the total peripheral surface area facing the center p-type region associated with the reference collector, and where the compensation current is also determined by the total surface area of the n-type compensator epitaxial region; and a $n^+$ buried layer located between the p-type substrate and the center and peripheral p-type regions.

11. The device of claim 10, wherein the ratio of the total peripheral surface area facing the center p-type region associated with the node collector and the total peripheral surface area facing the center p-type region associated with the reference collector is substantially the same as the ratio of the total surface area of the leaking epitaxial region and the total surface area of the compensator epitaxial region.

12. The compensation circuit of claim 10, wherein the integrated circuit functions as an integrator.

13. The device of claim 10, wherein the integrated circuit functions as a sample-and-hold circuit.

14. The device of claim 10, wherein the total peripheral surface area of the node collector and the total peripheral surface area of the reference collector are substantially the same.

15. The device of claim 14, wherein the total surface area of the leaking epitaxial region and the compensator epitaxial region are substantially the same.

16. A method for providing a compensation current to a node of an integrated circuit that experiences increased reverse-bias leakage current between a n-type leaking epitaxial region and a p-type substrate with increased temperature, the comprising the steps of:

providing a p-type substrate;

providing a n-type compensator epitaxial region formed on the p-type substrate;

providing a contact region formed into the n-type compensator epitaxial region;

providing a center p-type region formed into the n-type compensator epitaxial region; and providing a plurality of peripheral p-type regions formed into the n-type compensator epitaxial region surrounding the center p-type region, wherein at least one of the peripheral p-type regions is coupled to the contact region to serve as a reference collector, and wherein any remaining peripheral p-type region is coupled to the node of the integrated circuit that is experiencing increased reverse-bias leakage current to serve as a node collector, where the compensation current is substantially determined by the ratio of the total peripheral surface area facing the center p-type region associated with the node collector and the total peripheral surface area facing the center p-type region associated with the reference collector, and where the compensation current is also determined by the area of the n-type compensator epitaxial region.

17. The method of claim 16, wherein the contact region is a $n^+$ region.

18. The method of claim 16, further including the step of:

providing a $n^+$ buried layer located between the p-type substrate and the center and peripheral p-type regions.

19. The method of claim 16, wherein the ratio of the total peripheral surface area facing the center p-type region associated with the node collector and the total peripheral surface area facing the center p-type region associated with the reference collector is substantially the same as the ratio of the total surface area of the leaking epitaxial region and the compensator epitaxial region.

20. The method of claim 16, wherein the compensation circuit is monolithically formed on the same p-type substrate as the integrated circuit that experiences the increased reverse-bias leakage current.

21. The method of claim 16, wherein the integrated circuit functions as an integrator.

22. The method of claim 16, wherein the integrated circuit functions as a sample-and-hold circuit.

23. The method of claim 16, wherein the total peripheral surface area of the node collector and the total peripheral surface area of the reference collector are substantially the same.

24. The method of claim 23, wherein the total surface area of the leaking epitaxial region and the compensator epitaxial region are substantially the same.

* * * * *